(12) United States Patent
Tanaka

(10) Patent No.: US 8,432,015 B2
(45) Date of Patent: Apr. 30, 2013

(54) SEMICONDUCTOR DEVICE AND WIRE BONDING METHOD

(75) Inventor: Hiroaki Tanaka, Nisshin (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 380 days.

(21) Appl. No.: 12/677,123

(22) PCT Filed: Sep. 12, 2008

(86) PCT No.: PCT/IB2008/002379
§ 371 (c)(1),
(2), (4) Date: Mar. 9, 2010

(87) PCT Pub. No.: WO2009/034461
PCT Pub. Date: Mar. 19, 2009

(65) Prior Publication Data
US 2010/0207234 A1 Aug. 19, 2010

(30) Foreign Application Priority Data
Sep. 13, 2007 (JP) .................................. 2007-238001

(51) Int. Cl.
*H01L 23/52* (2006.01)
(52) U.S. Cl.
USPC .................... 257/503; 257/378; 257/E29.007

(58) Field of Classification Search .................. 257/503, 257/E29.007, 378, 409, 784
See application file for complete search history.

(56) References Cited

U.S. PATENT DOCUMENTS

| 2004/0173820 A1 | 9/2004 | Kinoshita et al. | |
| 2004/0188499 A1* | 9/2004 | Nosaka | 228/180.5 |
| 2008/0246165 A1* | 10/2008 | Hess et al. | 257/784 |

FOREIGN PATENT DOCUMENTS

| JP | 7-326711 | 12/1995 |
| JP | 2003-318360 | 11/2003 |
| JP | 2004-273647 | 9/2004 |
| JP | 2005-123388 | 5/2005 |
| JP | 2005-129826 | 5/2005 |

\* cited by examiner

*Primary Examiner* — Chuong A Luu
*Assistant Examiner* — Nga Doan
(74) *Attorney, Agent, or Firm* — Finnegan, Henderson, Farabow, Garrett & Dunner, LLP

(57) ABSTRACT

A semiconductor device (2) includes: a FLR (65) that is disposed on a semiconductor substrate so as to divide the semiconductor substrate into an inner region and an outer region; a first bonding pad (24*a* to 24*d*) that is disposed in the inner region and is connected to an external circuit by a wire (14*a* to 14*d*) whose one end is connected to the external circuit; and a second bonding pad (26*a* to 26*d*) that is disposed in the outer region and on which the other end of the wire is bonded.

10 Claims, 10 Drawing Sheets

SEMICONDUCTOR DEVICE AND WIRE BONDING METHOD

CROSS-REFERENCE TO RELATED APPLICATIONS

This application is a national phase application of International Application No. PCT/IB2008/002379, filed Sep. 12, 2008, and claims the priority of Japanese Application No. 2007-238001, filed Sep. 13, 2007, the contents of both of which are incorporated herein by reference.

BACKGROUND OF THE INVENTION

1. Field of the Invention

The invention relates to a semiconductor device including a bonding pad, and also relates to a wire bonding method.

2. Description of the Related Art

A wire bonding method has been available as a method of electrically connecting a semiconductor device to an external circuit. In the wire bonding method, a wire whose one end is bonded to the external circuit is extended to above a bonding pad formed on a surface of the semiconductor device, and bonded on the bonding pad. After the wire is bonded on the bonding pad, the bonded wire is cut. The bonding pad will be hereinafter simply referred to as a "pad".

There is a semiconductor device that requires various pads. For example, a semiconductor device for electric power control requires at least one electric power pad and a signal pad. A wire, through which the controlled electric power flows, is bonded on the at least one electric power pad. A wire, which transmits a signal to switch between on and off of the semiconductor device, is bonded on the signal pad. In addition to the signal pad as described above, the semiconductor device may include a pad on which a wire that transmits a signal corresponding to an amount of current flowing through the semiconductor device is bonded, or a pad on which a wire that transmits a signal corresponding to a temperature of the semiconductor device is bonded. For example, Japanese Patent Application Publications No. 2005-129826 (JP-A-2005-129826) and No. 7-326711 (JP-A-7-326711) describe a semiconductor device that includes a pad on its surface, and a device that bonds a wire to the pad.

It is difficult to form a semiconductor structure required for operating the semiconductor device in a portion of a semiconductor substrate below the signal pad on which the wire that transmits the signal is bonded. This is because i) unstable operation of the semiconductor device due to the voltage applied to the signal pad needs be avoided; and ii) a thick oxide layer needs to be formed to insulate the semiconductor structure from the signal pad in order to detect a temperature.

In a high-voltage semiconductor device, an electric field tends to concentrate in a terminal region of the semiconductor substrate, and this causes deterioration of voltage-resistant performance of the semiconductor device. In order to avoid this, there has been proposed the technology in which a field limiting ring (FLR) is disposed on an outer peripheral portion of a surface of the semiconductor substrate to continuously extend along an outer periphery of the semiconductor substrate. In order to improve the voltage-resistant performance of the semiconductor device using the FLR, it is necessary to dispose the semiconductor structure, which is required for operating the semiconductor device, in a region inside the FLR.

In the semiconductor device in which the FLR is provided so as to improve the voltage-resistant performance, the signal pad needs to be provided in the region inside the FLR. If a conductive region, which is provided to secure electrical connection between the signal pad and a semiconductor region constituting the semiconductor structure, is disposed across the FLR, it is difficult to improve the voltage-resistant performance using the FLR.

The following is the summary of what is described above. (1) When the semiconductor device includes the FLR that is disposed on the outer peripheral portion of the surface of the semiconductor substrate to continuously extend along the outer periphery of the semiconductor substrate in order to improve the voltage-resistant performance, the semiconductor structure needs to be disposed in the region inside the FLR. Therefore, it is not possible to use the entire area of the semiconductor substrate solely for forming the semiconductor structure. (2) In addition to the semiconductor structure, the signal pad needs to be disposed in the region inside the FLR. However, it is not possible to provide the semiconductor structure below the signal pad. Therefore, because the signal pad needs to be disposed in the region inside the FLR as well as the semiconductor structure, the effective area of the semiconductor substrate for forming the semiconductor structure is further reduced. In the semiconductor device according to the related art, the effective area for forming the semiconductor structure required for operating the semiconductor device is reduced.

If the process involves only wire bonding, it is possible to bond the wire on a small-sized pad. However, if the process involves cutting of the wire bonded on the pad as well, the pad needs to be large enough. When the wire is to be cut, the wire is pressed against the pad, using a tool, at the position where the wire is bonded on the pad, and then the wire is cut (it should be noted, although it is apparent, that the wire is cut at an end that is opposite to an end connected to the external circuit). When the wire is cut, the wire-cutting process leaves a drag mark on the surface of the semiconductor device. Therefore, it is necessary to prevent the surface of a protective layer, which is formed to cover the surface of the semiconductor device, from being damaged by the drag mark. In order to do so, it is necessary to use a pad that is large enough to cover a formation area in which the drag mark may be formed. The pad on which the wire is bonded and cut needs to be made larger than the pad on which the wire is bonded, but does not need to be cut.

SUMMARY OF THE INVENTION

The invention provides a technology for increasing an effective area of a semiconductor substrate for forming a semiconductor structure required for operating a semiconductor device.

A first aspect of the invention relates to a semiconductor device. The semiconductor device includes: a field limiting ring that is disposed on an outer peripheral portion of a surface of a semiconductor substrate to continuously extend along an outer periphery of the semiconductor substrate; a first bonding pad that is disposed in a region of the semiconductor substrate inside the field limiting ring, and is electrically connected to a semiconductor region formed in the semiconductor substrate; and a second bonding pad that is disposed in a region of the semiconductor substrate outside the field limiting ring, and is insulated from the semiconductor region formed in the semiconductor substrate. According to the semiconductor device, it is possible to increase the effective area for forming the semiconductor structure required for operating the semiconductor device.

In the aforementioned semiconductor device, a wire may be bonded on the first bonding pad and the second bonding pad to connect the first bonding pad to the second bonding pad, and the wire may be cut on the second bonding pad.

A wire whose one end is connected to an external circuit may be bonded on the first bonding pad. The other end of the wire may be bonded on the second bonding pad.

The first bonding pad may be shorter than the second bonding pad.

An area of the first bonding pad may be smaller than an area of the second bonding pad.

A size of the first bonding pad may be equal to or larger than a size required for bonding the wire on the first bonding pad.

A size of the second bonding pad may be equal to or larger than a size obtained by summing a size required for bonding the wire on the second bonding pad, and a size of a drag mark formed by cutting the wire.

The semiconductor device may be polygonal in a plan view; and the second bonding pad may be disposed between a corner point of the polygonal semiconductor device and a portion of the field limiting ring that is closest to the corner point.

The first bonding pad may be disposed in a portion of the semiconductor substrate adjacent to the portion of the field limiting ring that is closest to the corner point of the polygonal semiconductor device.

A second aspect of the invention relates to a semiconductor device. The semiconductor device includes: a field limiting ring that is disposed on a semiconductor substrate so as to divide the semiconductor substrate into an inner region and an outer region; a first bonding pad that is disposed in the inner region and is connected to an external circuit by a wire whose one end is connected to the external circuit; and a second bonding pad that is disposed in the outer region and on which the other end of the wire is bonded.

In the semiconductor device configured as described above, when the semiconductor device is connected to the external circuit by wire bonding, as a first step, the wire whose one end is connected to the external circuit is bonded on the first pad. Then, without cutting the wire on the first pad, the wire is bonded on the second pad, and is cut on the second pad. In other words, the wire is bonded on the first and the second pads to connect the first pad to the second pad so that the other end of the wire is placed on the second pad. Therefore, when the wire is bonded on the first pad, the process of cutting the wire on the first pad is not required any more. In the semiconductor device according to the invention, the process of cutting the wire on the first pad is not required any more, and a drag mark is not formed on the first pad by the wire-cutting process. Thus, it is not necessary to make the first pad large enough to cover a formation area in which the drag mark may be formed. In this way, it is possible to reduce the area of the first pad to the area required for bonding the wire on the first pad, and this makes it possible to increase the effective area for forming the semiconductor structure required for operating the semiconductor device. The semiconductor device according to the invention requires the second pad. However, the second pad is disposed in the region outside the FLR, and the semiconductor device includes the region large enough to dispose the second pad because the region outside the FLR needs to be large to some extent in order to secure voltage resistance. Accordingly, providing the second pad does not reduce the effective area for forming the semiconductor structure.

When the semiconductor device is polygonal in a plan view, the second pad may be disposed in a region outside the FLR which extends to curve at corner portions of the polygonal semiconductor device. When the semiconductor device is polygonal in a plan view, the FLR is curved at the corner portions of the semiconductor device in order to avoid electric field concentration. For example, when each of the corners of the polygonal semiconductor device has an angle smaller than 180°, such as an acute angle or an obtuse angle, the FLR has a large curvature radius and is curved so that corner portions of the FLR protrude toward the outer portion of the semiconductor device. Therefore, the region outside the FLR at the corner portion of the semiconductor device is formed to be larger than the region outside the FLR at any other peripheral portion of the semiconductor device. Thus, the region outside the FLR at the corner portion of the semiconductor device is large enough to form the second pad. Accordingly, it is possible to increase the effective area of the semiconductor device while avoiding an increase in the total area of the semiconductor device.

When the second pad is disposed in the region outside the FLR at the corner portion of the semiconductor device, the first pad may be disposed in a portion that is inside and adjacent to the curved corner of the FLR, which extends to curve at the corner portions of the polygonal semiconductor device. In this configuration, it is possible to dispose the first pad and the second pad adjacent to each other with the FLR interposed therebetween. This shortens the wire that connects the first pad to the second pad. When a plurality of first pads and a plurality of second pads are provided, it is possible to reduce the possibility of a short circuit among the wires.

A third aspect of the invention relates to a wire bonding method of bonding a wire to the semiconductor device. The wire bonding method includes: bonding the wire, whose one end is connected to an external circuit, on the first bonding pad without cutting the wire; and bonding the other end of the wire, which is not cut on the first bonding pad, on the second bonding pad; and cutting the wire on the second bonding pad. In the wire bonding method, the wire is not cut on the first pad. Therefore, it is possible to reduce the area of the first pad to the area required for only the bonding. Thus, it is possible to increase the effective area of the semiconductor device.

According to the invention, the process of cutting the wire on the first pad is not required any more, and therefore, it is possible to reduce the size of the first pad to the size required for only the bonding. This increases the effective area for forming the semiconductor structure required for operating the semiconductor device. In this way, it is possible to improve electrical characteristics of the semiconductor device, and thus, it is possible to manufacture the high-quality semiconductor device.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF THE PREFERRED EMBODIMENTS

First of all, the main features of embodiments of the invention, which will be described below, will be summarized. (Feature 1) A thick oxide layer is formed in a region outside a field limiting ring (FLR). (Feature 2) Grooves are formed between a second pad and an EQR so that the second pad is insulated from the EQR. (Feature 3) When the effective area for forming a semiconductor structure remains the same, it is possible to reduce the total area of a semiconductor device by reducing an area of a first pad. This reduces production cost of the semiconductor device. (Feature 4) When the area of a semiconductor substrate is the same, it is possible to increase the effective area for forming the semiconductor structure by reducing the area of the first pad.

Figure 1:
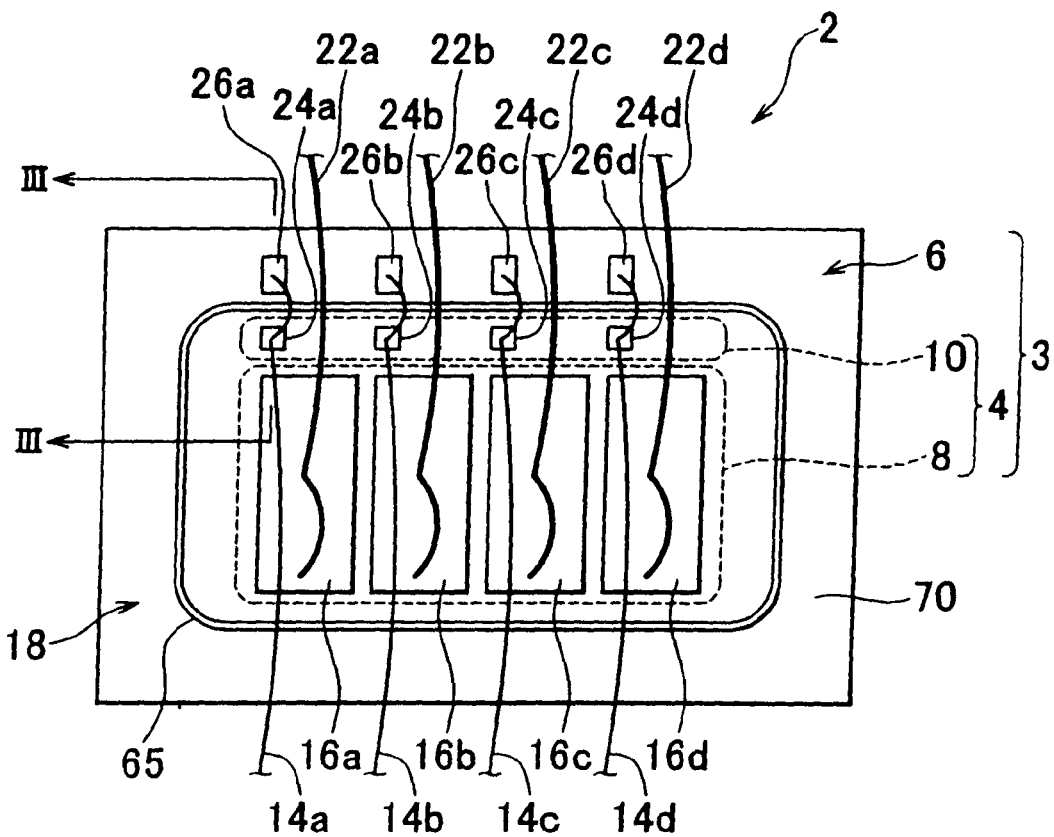
FIG. 1 shows a semiconductor device 2 according to a first embodiment of the invention.

FIG. 1 shows a semiconductor device 2 according to a first embodiment of the invention. The semiconductor device 2 includes a terminal voltage-resistant region 18 that is disposed in an outer peripheral portion of the semiconductor substrate 3 to continuously extend along an outer periphery of the semiconductor substrate 3. The terminal voltage-resistant region 18 includes two field limiting rings (FLR) 65 in a manner such that one of the FLRs 65 is disposed inside the other FLR 65. It should be noted that the one FLR 65 disposed inside will be hereinafter referred to as "inner FLR 65", and the other FLR 65 will be referred to as "outer FLR 65". An active region 4 is formed inside the inner FLR 65, and an inactive region 6 is formed outside the outer FLR 65. The active region 4 includes a semiconductor region 8 and a pad region 10. The semiconductor region 8 constitutes a semiconductor structure. Further, the pad region 10 includes four first pads 24a, 24b, 24c, 24d, which are electrically connected to the semiconductor region 8. It should be noted that if alphabetical symbols attached to one reference numeral are omitted in the description below, it means that the description is common to the components denoted by the same reference numeral. The semiconductor structure is not formed in the pad region 10 of the semiconductor substrate 3. As the pad region 10 becomes smaller, the semiconductor region 8 is made larger. The inactive region 6 includes an electrically conductive field plate 70 and four second pads 26a, 26b, 26c, 26c that are insulated from the semiconductor region 8. The reference symbols 22a, 22b, 22c, 22d denote wires. The wires 22a, 22b, 22c, 22d are bonded to respective four emitter electrode pads 16a, 16b, 16c, 16d that are exposed to a surface of the semiconductor region 8 of the semiconductor device 2, and electrically connect an external circuit (not shown) to the emitter electrode pads 16a, 16b, 16c, 16d. The reference symbols 14a, 14b, 14c, 14d also denote wires. The wires 14a, 14b, 14c, 14d are bonded to the respective first pads 24a, 24b, 24c, 24d formed on the surface of the pad region 10 of the semiconductor device 2, and electrically connect the external circuit (not shown) to the first pads 24. Terminal ends of the wires 14a, 14b, 14c, 14d, are bonded to the respective second pads 26a, 26b, 26c, 26d formed in the inactive region 6.

Figure 3:
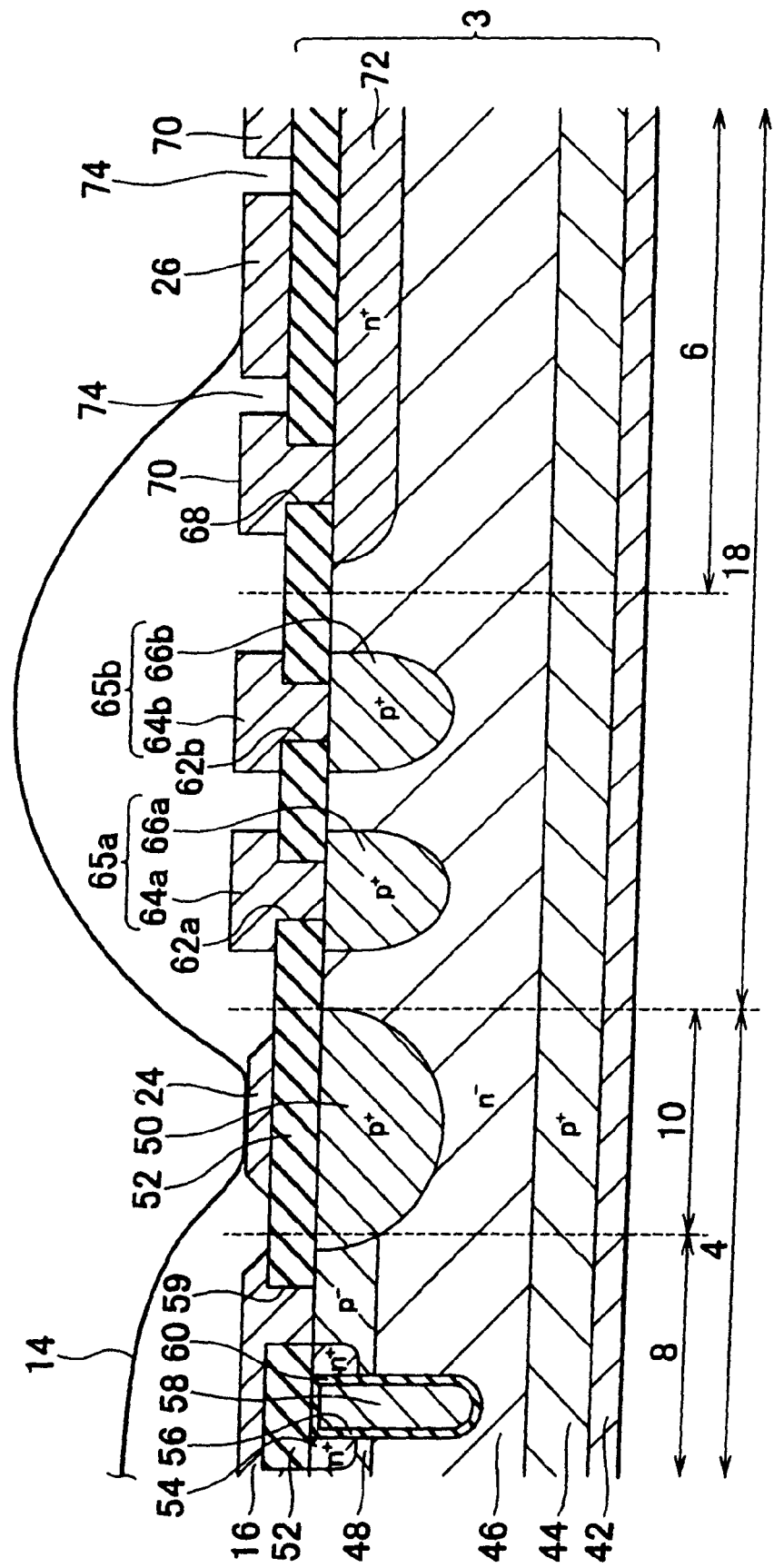
FIG. 3 is a sectional view showing the semiconductor device 2.

FIG. 3 is a sectional view of the semiconductor device 2 taken along the line III-III in FIG. 1. The semiconductor region 8 in the active region 4 of the semiconductor device 2 includes an insulated gate bipolar transistor (hereinafter referred to as "IGBT"). The semiconductor device 2 is formed in one sheet of the semiconductor substrate 3 that contains n-type impurity at low concentration, and an unprocessed portion of the semiconductor substrate 3 functions as a drift region 46. A body region 48 contains p-type impurity at low concentration, and is formed on the surface of the drift region 46, and an emitter region 54 contains the n-type impurity at high concentration, and is formed on the surface of the body region 48. The emitter region 54 is separated from the drift region 46 by the body region 48 disposed therebetween. A trench 56 is formed on the surface of the emitter region 54 so as to extend through the emitter region 54 and the body region 48 to reach the drift region 46. A gate insulation layer 60 covers a bottom surface and a wall surface of the trench 56, and a trench gate electrode 58 is filled in the trench 56. The gate insulation layer 60 also covers an upper surface of the trench gate electrode 58. In the surface of the semiconductor device 2, an oxide layer 52 is formed in an area in the semiconductor region 8, in which the emitter region 54 and the trench 56 are formed. On the surface of the semiconductor device 2 including the surface of the oxide layer 52, emitter electrode pads 16 are formed in the semiconductor region 8. The emitter electrode pads 16 are electrically connected to the emitter region 54. Further, the emitter electrode pads 16 are electrically connected to the body region 48 through a contact 59 formed on the oxide layer 52. The first pads 24 for gate electrode connection are formed on the surface of the pad region 10 of the semiconductor device 2. The trench gate electrode 58 is exposed to the surface of the semiconductor device 2 in a sectional view, which is not shown in the drawings, and connected to the first pads 24 for gate electrode connection. A p-type diffusion region 50 contains the p-type impurity at high concentration. On the surface of the drift region 46, the p-type diffusion region 50 is formed in the pad region 10 of the semiconductor device 2, on which the first pads 24 for gate electrode connection are disposed. The p-type diffusion region 50 is electrically connected to the terminal portion of the body region 48 that contains the p-type impurity. A collector region 44 contains the p-type impurity at high concentration, and is formed close to a back surface of the semiconductor device 2. Further, a collector electrode 42 is formed in the back surface of the semiconductor device 2. The collector electrode 42 is electrically connected to the collector region 44.

Guard rings 66a, 66b contain the p-type impurity at high concentration. On the surface of the drift region 46, the guard rings 66a, 66b are formed in the terminal voltage-resistant region 18 of the semiconductor device 2. Each of the guard rings 66 functions to prevent deterioration of the voltage-resistant characteristics of the semiconductor device 2 caused by the electric field generated in the active region 4 being concentrated in the terminal region of the semiconductor substrate 3. The number of the guard ring(s) 66 may vary depending on the required voltage-resistant characteristics.

In FIG. 1, the two guard rings 66 are provided. However, the number is not limited to two, and three or more guard rings 66 may be provided, or only one guard ring 66 may be provided. Field plates 64a, 64b, which are electrically conductive, are formed on the surface of the oxide layer 52 in the terminal voltage-resistant region 18. The guard rings 66a, 66b are electrically connected to the field plates Ma, 64b, respectively, through respective contact holes 62a, 62b formed in the oxide layer 52 in the terminal voltage-resistant region 18. The guard ring 66a and the field plate 64a together function as the FLR 65a, and the guard ring 66b and the field plate 64b together function as the FLR 65b. A channel stopper region 72 contains the n-type impurity at high concentration. On the surface of the drift region 46, the channel stopper region 72 is formed in the inactive region 6 of the semiconductor device 2. The channel stopper region 72 functions to prevent the electric field produced in the active region 4 from expanding to reach the terminal region of the semiconductor substrate 3. On the surface of the oxide layer 52, the field plate 70 and the second pads 26 are formed in the inactive region 6. Grooves 74 are formed between the field plate 70 and the second pads 26 so that the second pads 26 are insulated from the field plate 70. The channel stopper region 72 and the field plate 70 are electrically connected to each other through a contact hole 68 formed in the oxide layer 52 in the inactive region 6. The channel stopper region 72 and the field plate 70 together function as an equipotential ring (hereinafter referred to as "EQR").

Figure 7:
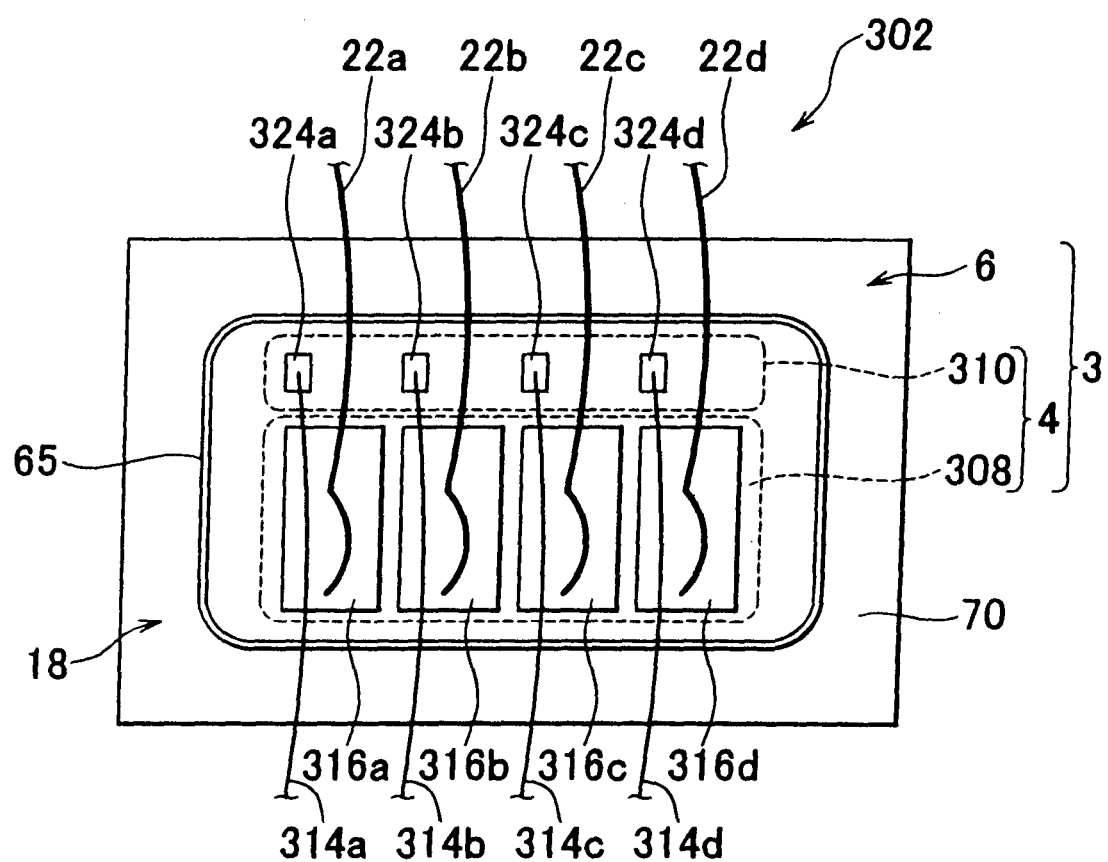
FIG. 7 is a diagram showing a semiconductor device 302 according to related art, which corresponds to FIG. 1.

In the semiconductor device 2 according to the invention, when the semiconductor device 2 is connected to the external circuit by wire bonding using the first pads 24, as a first step, the wires 14 whose one ends are bonded to the external circuit are bonded on the respective first pads 24, as shown in FIG. 1, and then bonded on the respective second pads 26. The wires 14 are then cut on the second pads 26. In this way, the wires 14 are bonded to connect the first pads 24 to the respective second pads 26, and are cut on the second pads 26 to place the other ends of the wires 14 on the respective second pads 26. Therefore, the wires 14 are not cut on the first pads 24. In contrast, a semiconductor device 302 according to the related art as shown in FIG. 7 is connected to the external circuit by wire bonding using first pads 324. More specifically, wires 314a, 314b, 314c, 314d whose one ends are bonded to the external circuit are bonded on the respective first pads 324a, 324b, 324c, 324d, and are cut on the first pads 324 to place the other ends of the wires 314 on the respective first pads 324. Thus, because the wires 14 are not cut on the first pads 24 in the semiconductor device according to the invention, it is possible to reduce the size and area of each of the first pads 24. The reason will be described by explaining the procedure of the wire bonding method shown in FIGS. 9 to 13.

Figure 9:
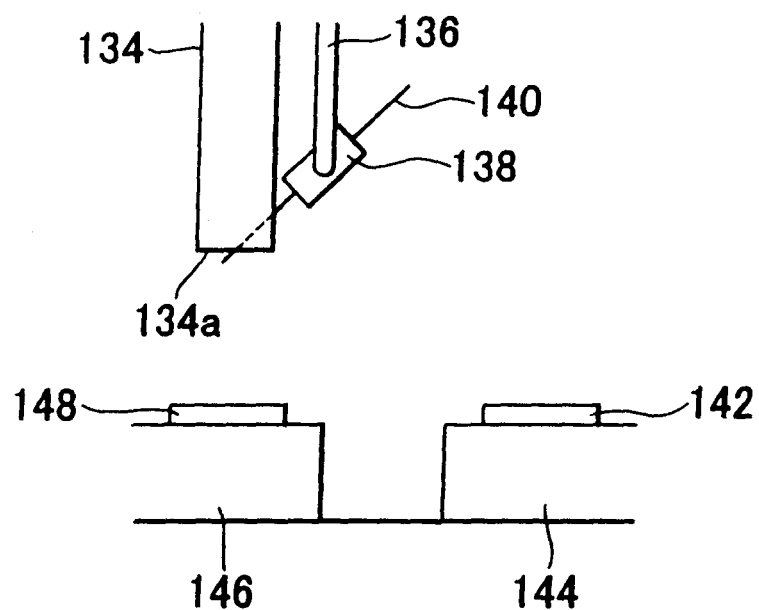
FIG. 9 shows a step in a procedure of a wire bonding method according to related art.
Figure 10:
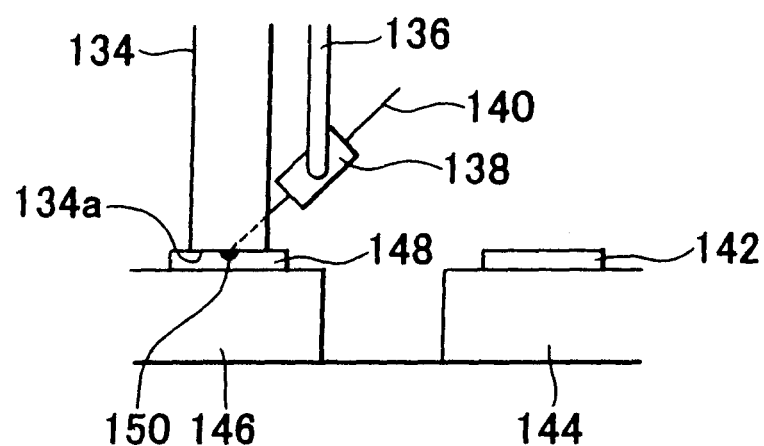
FIG. 10 shows a step in the procedure of the wire bonding method according to the related art.
Figure 11:
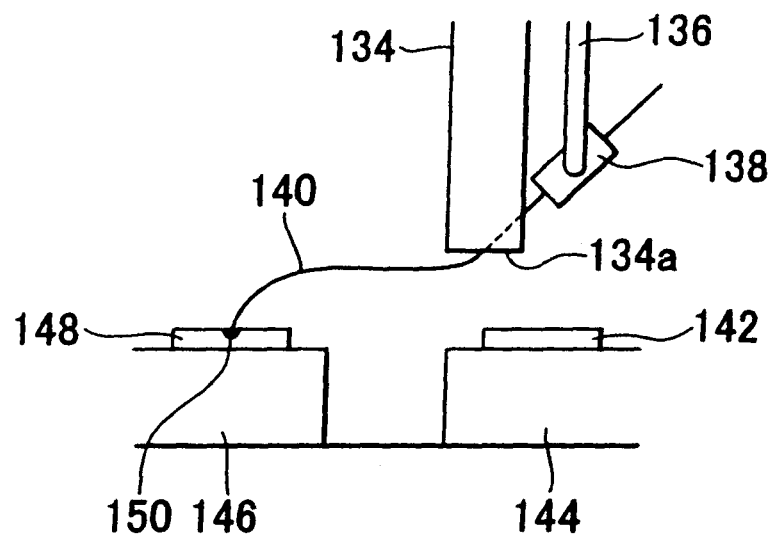
FIG. 11 shows a step in the procedure of the wire bonding method according to the related art.
Figure 12:
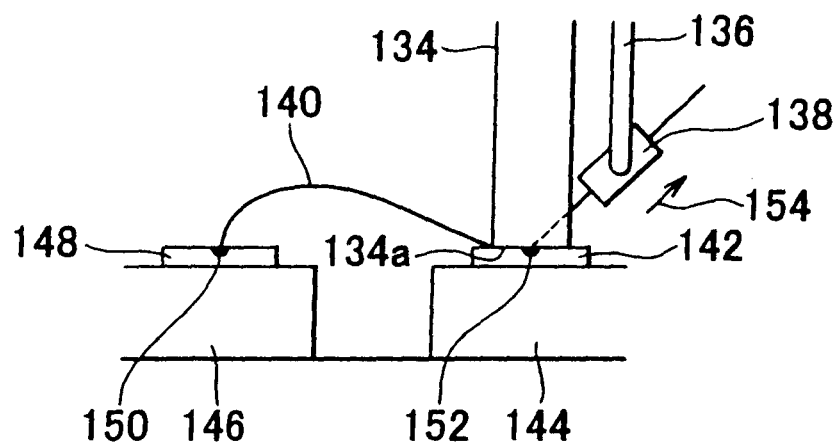
FIG. 12 shows a step in the procedure of the wire bonding method according to the related art.

FIGS. 9 to 13 show the wire bonding method to connect an external circuit 146 to a semiconductor device 144 according to the related art. As shown in FIG. 9, a wire 140 is inserted through a clamp 138 and a wedge tool 134, and a tip end of the wire 140 sticks out from a bottom surface 134a of the wedge tool 134. The clamp 138 functions to support the wire 140, and is connected to the wedge tool 134 through a support member 136. In this way, the wire 140, the clamp 138, and the wedge tool 134 move together. In the wire bonding method used herein, as a first step, the bottom surface 134a of the wedge tool 134 is pressed against a lead 148 of the external circuit 146 to bond the wire 140 to the lead 148, as shown in FIG. 10. Thus, a bonding mark 150 is formed on the surface of the lead 148. Next, as shown in FIG. 11, the wire 140, the clamp 138, and the wedge tool 134 are moved to above a pad 142 of the semiconductor device 144, to which the wire 140 is next bonded. Then, as shown in FIG. 12, the bottom surface 134a of the wedge tool 134 is pressed against the pad 142 of the semiconductor device 144 to bond the wire 140 on the pad 142. Thus, a bonding mark 152 is formed on the surface of the pad 142.

Figure 13:
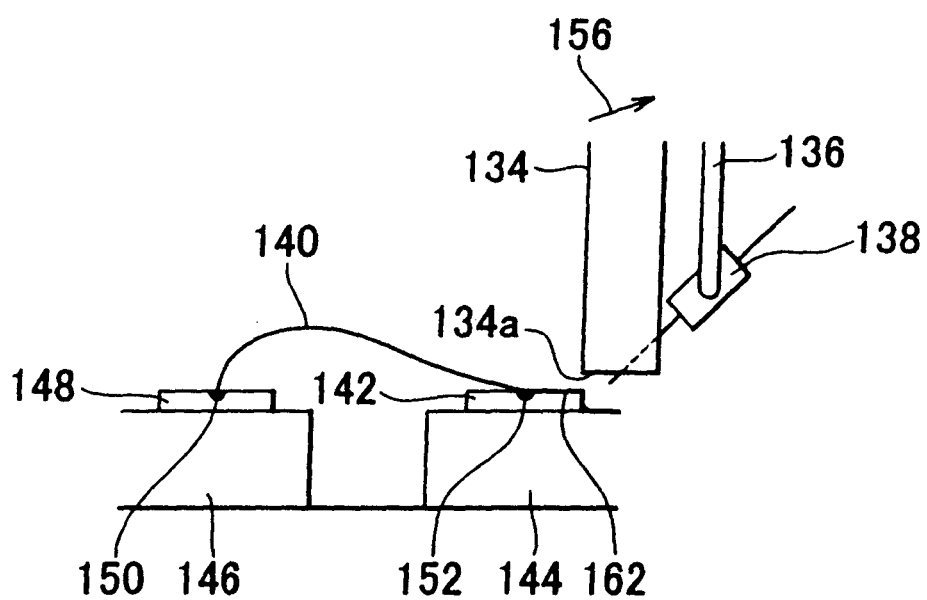
FIG. 13 shows a step in the procedure of the wire bonding method according to the related art.
Figure 14:
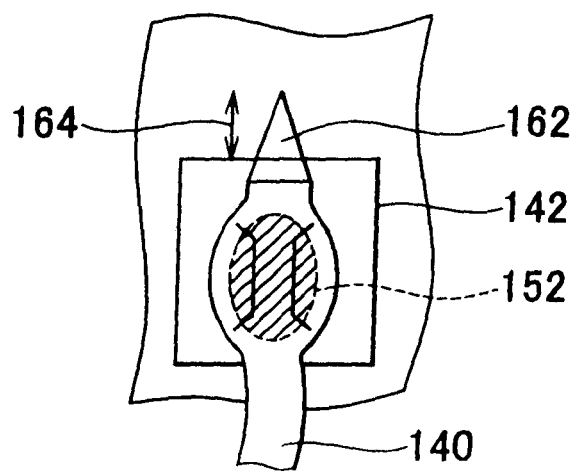
FIG. 14 shows a problem of the related art arising when the wire bonding method of the related art is used.

After the wire 140 is bonded on the pad 142, as shown in FIG. 12, the clamp 138 is moved in the direction indicated by the arrow 154 with respect to the wedge tool 134, while the wedge tool 134 is held on the pad 142. This tears off the wire 140 pinched between the pad 142 and the wedge tool 134. At this time, a drag mark 162 is formed on the surface of the semiconductor device 144 by the torn-off wire 140, as shown in FIG. 13. Then, the wedge tool 134 and the clamp 138 are together moved upward in the direction indicated by the arrow 156, thereby finishing the wire bonding method. As shown in FIG. 14, if the pad 142 has a size equivalent to the size of the bonding mark 152, the drag mark 162 is formed to exceed the pad 142, and a protective layer on the surface of the semiconductor 144 is damaged at the portion indicated by the arrow 164 (the portion will be hereinafter referred to as "damaged portion 164"). When the damaged portion 164 is formed in the protective layer, impurities, etc., enter the semiconductor device 144 through the damaged portion 164, causing degradation of the characteristics of the semiconductor device 144 and breakage of the semiconductor device 144. Therefore, in order to cut the wire 140 on the pad 142, the pad 142 needs to be formed to be large enough to cover a formation area in which the drag mark 28 may be formed, as the pad 324 shown in FIG. 8.

Figure 8:
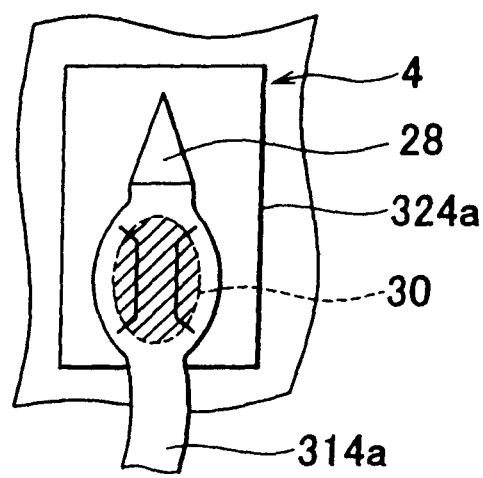
FIG. 8 is an enlarged view showing a first bonding pad 324a of the semiconductor device 302 according to the related art, which corresponds to FIG. 2A.

The drag mark 162 may be formed on the pad 142 of the semiconductor device 144 not exclusively when the wire 140 is torn off by moving the clamp 138. The wedge tool 134 includes a wire cutter for cutting the wire 140, and the drag mark 162 may also be formed on the pad 142 when the wire 140 is cut by the wire cutter. In this case as well, the pad 142 needs to be formed to be large enough in order to avoid damaging the protective layer of the semiconductor device 144, as the pad 324 as shown in FIG. 8.

Figure 2A:
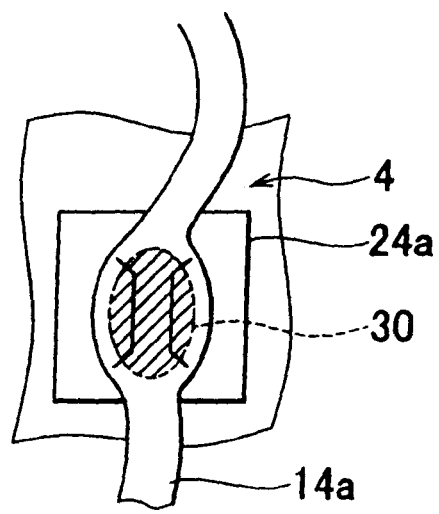
FIG. 2A is an enlarged view showing a first bonding pad 24a of the semiconductor device 2.

In the semiconductor device 2 according to the first embodiment of the invention, the wire 14 is not cut on each of the first pads 24 formed in the active region 4. Therefore, the drag mark is not formed on the first pad 24. Accordingly, as shown in FIG. 2A, it is possible to reduce the size of the first pad 24 (the first pad 24a is shown in the drawing as an example) to the size that is substantially equivalent to the size of a formation area where a bonding mark 30 may be formed. This makes it possible to reduce the area of the pad region 10 formed in the active region 4 as shown in FIG. 1, compared to that of the semiconductor device 302 according to the related art as shown in FIGS. 7 and 8. This further makes it possible to increase the area of the semiconductor region 8 formed in the active area 4, thereby improving the electrical characteristics of the semiconductor device 2. In the semiconductor device 2 according to the first embodiment, the second pads 26 are insulated from the semiconductor region 8 by the thick oxide layer 52 provided therebetween. Therefore, even when electric signals input to the first pads 14 through the wires 24 are also input to the second pads 26, the semiconductor region 8 is not affected. Further, even when high-voltage signals are input to the second pads 26, a reversed phase is prevented from being generated in the channel stopper region 72 because of the thick oxide layer 52. Further, the second pads 26 do not affect the inactive region 6.

Figure 2B:
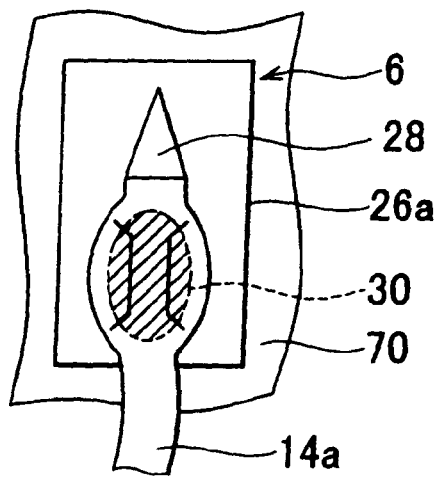
FIG. 2B is an enlarged view showing a second bonding pad 26a of the semiconductor device 2.

Each of the first pads 24 formed in the active region 4 is shorter than each of the second pads 26 formed in the inactive region 6. As shown in FIG. 2B, in order to cut the wire 14 on the second pad 26, the second pad 26 (in FIG. 2B, the second pad 26a is shown as an example) needs to be formed to be large enough to cover the formation area in which the drag mark 28 may be formed, as the first pad 324a of the related art shown in FIG. 8. In the semiconductor device 2 according to the first embodiment, the first pad 24 is shorter than the second pad 26. Therefore, it is possible to reduce the area of the first pad 24 of the semiconductor device 2 according to the first embodiment as shown in FIG. 1, compared to the area of the first pad 324 of the semiconductor device 302 according to the related art as shown in FIG. 7. This reduces the area of the pad region 10 in the active region 4.

Figure 4:
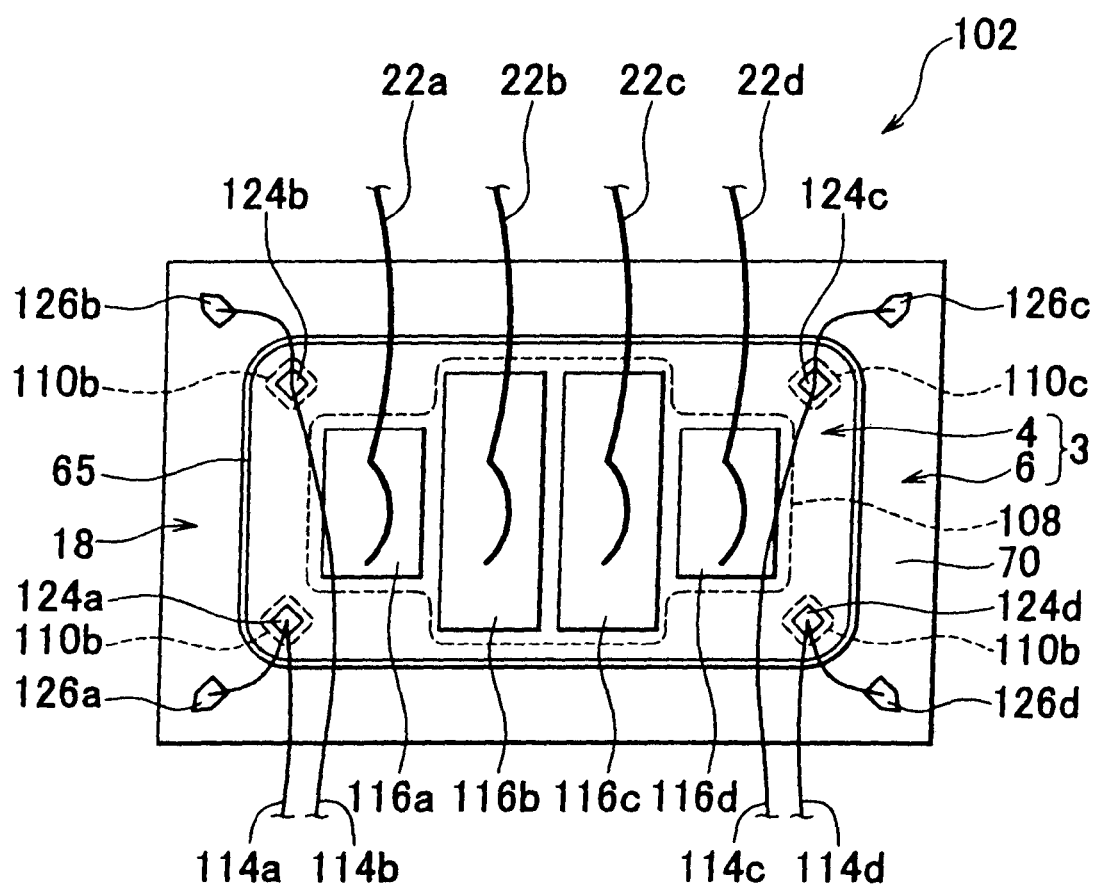
FIG. 4 shows a semiconductor device 102 according to a second embodiment of the invention.
Figure 5:
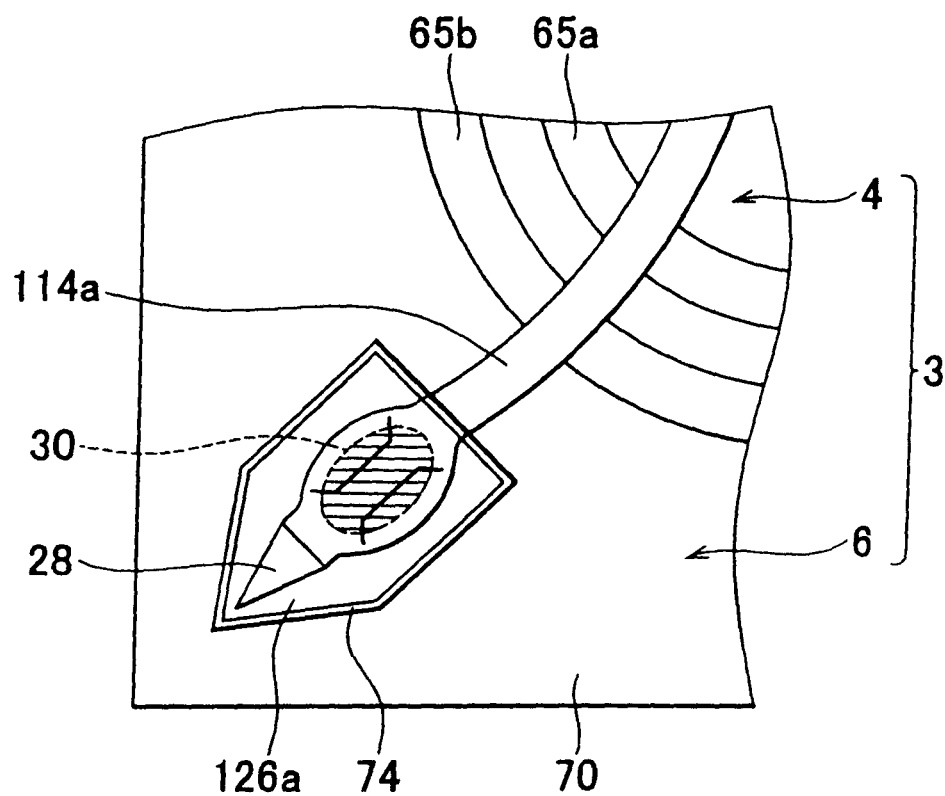
FIG. 5 is an enlarged view showing a second bonding pad 126a of the semiconductor device 102.

FIG. 4 shows a semiconductor device 102 according to a second embodiment of the invention. As shown in FIG. 4, when the semiconductor device 102 is configured to be polygonal (rectangular shape in FIG. 4) in a plan view, four second pads 126a, 126b, 126c, 126d are disposed at respective corner portions of the semiconductor device 102, which are outside the outer FLR 65 that extends to curve at the corner portions of the polygonal semiconductor device 102. As shown in FIG. 4, the FLRs 65 are curved at the corner portions of the polygonal semiconductor device 102 in order to prevent the electric field concentration in the terminal region of the active region 4. FIG. 5 is an enlarged view showing one of the corner portions of the semiconductor device 102, in which the second pad 126a is formed. When each of the corners of the semiconductor device 102 has an angle smaller than 180°, each FLR 65 has a large curvature radius and is curved so that the corners of the FLR 65 protrude toward the outer portion of the semiconductor device 102. Therefore, the inactive region 6 at each corner portion of the semiconductor device 102 is larger than the inactive region 6 at any other peripheral portion of the semiconductor device 102. This makes it possible to make the corner portions large enough to form the respective second pads 126, and it is not necessary to increase the total area of the semiconductor device 102 in order to form the second pads 126. In other words, it is possible to reduce the total area of four pad regions 110a, 110b, 110c, 110d, without increasing the total area of the semiconductor device 102.

Figure 6:
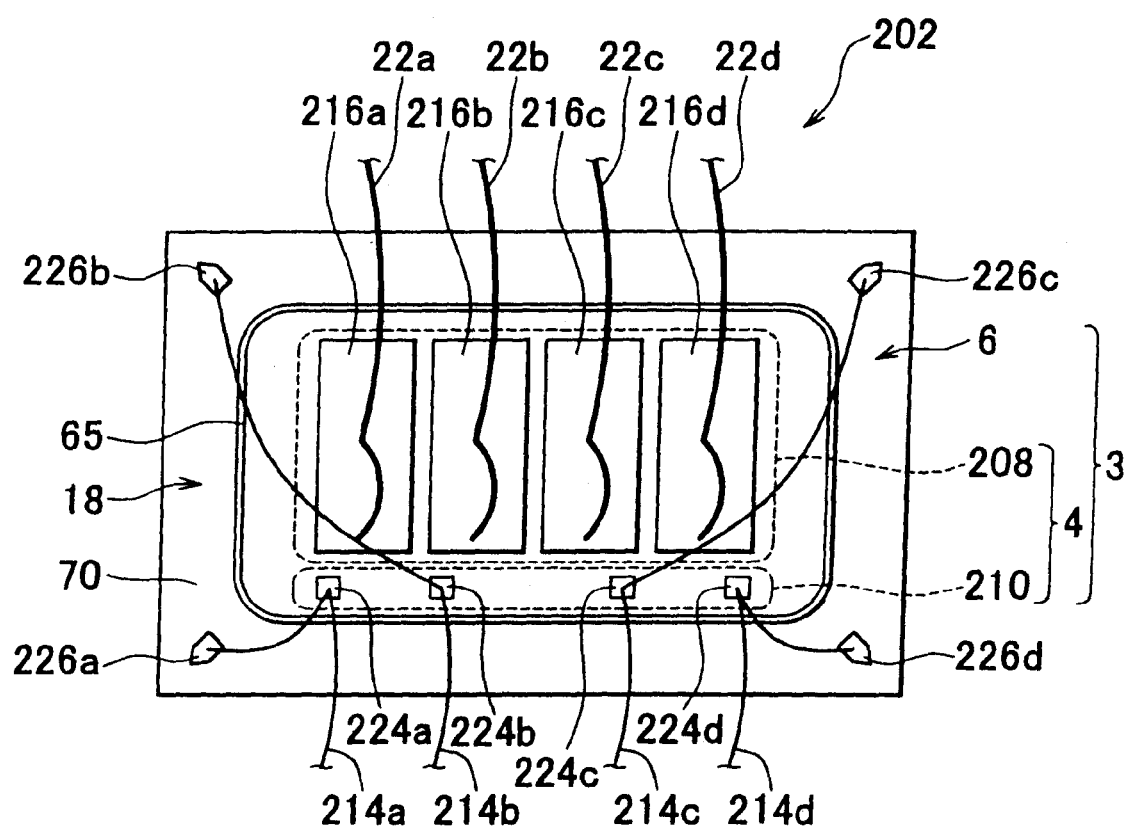
FIG. 6 shows a semiconductor device 202 according to a third embodiment of the invention.

When the second pads 126 are disposed on the inactive region at the corner portions of the semiconductor device 102, it is preferable that four first pads 124a, 124b, 124c, 124d be formed at portions that are inside and adjacent to the curved corners of the inner FLR 65, which extends to curve at the corner portions of the polygonal semiconductor device 102. This makes it possible to dispose each of the first pads 124 and the corresponding second pad 126 adjacent to each other with the FLRs 65 interposed therebetween. Thus, it is possible to shorten the wires 114a, 114b, 114c, 114d that connect the first pads 124a, 124b, 124c, 124d, to the second pads 126a, 126b, 126c, 126d, respectively. As a result, it is possible to suppress occurrence of a short circuit among the wires 114. However, even when the second pads 126 are disposed on the inactive region 6 at the corner portions of the polygonal semiconductor device 102, the first pads 126 are not necessarily disposed on the active region 4 at the portions of the semiconductor device 102 adjacent to the corners of the inner FLR 65. FIG. 6 shows a semiconductor device 202 according to a third embodiment of the invention in which second pads 226a, 226b, 226c, 226d are disposed on the inactive region 6 at the corner portions of the semiconductor device 202, while first pads 224a, 224b, 224c, 224d are not disposed at the portions adjacent to the corners of the inner FLR 65. According to the third embodiment as well, because the second pads 226 are disposed on the inactive region 6 at the corner portions of the semiconductor device 202, it is possible to reduce the area of a pad region 210 in the active region 4 without increasing the total area of the semiconductor device 202.

While the embodiments of the invention have been described in detail, the aforementioned embodiments are example embodiments of the invention. For example, in the aforementioned embodiments, the semiconductor device includes the four first pads and the four second pads. However, the number of the first pads and the second pads is not limited to a specific number. For example, the semiconductor device may include the two first pads and the two second pads.

Further, the field plate of the equipotential ring and the second pad may be formed in the same process.

While the invention has been described with reference to example embodiments thereof, it is to be understood that the invention is not limited to the described embodiments or constructions. To the contrary, the invention is intended to cover various modifications and equivalent arrangements. In addition, while the various elements of the disclosed invention are shown in various example combinations and configurations, other combinations and configurations, including more, less or only a single element, are also within the scope of the appended claims.

The invention claimed is:

1. A semiconductor device comprising:
    a field limiting ring that is disposed on an outer peripheral portion of a surface of a semiconductor substrate to continuously extend along an outer periphery of the semiconductor substrate;
    a first bonding pad that is disposed in a region of the semiconductor substrate inside the field limiting ring, and is electrically connected to a semiconductor region formed in the semiconductor substrate;
    a second bonding pad that is disposed in a region of the semiconductor substrate outside the field limiting ring, and is insulated from the semiconductor region formed in the semiconductor substrate; and
    a wire with one end bonded to an external circuit, a middle portion of the wire being bonded on the first bonding pad, and the other end of the wire being bonded on the second bonding pad, wherein the middle portion of the wire is in-between the one end and the other end.

2. The semiconductor device according to claim 1, wherein the wire is bonded on the first bonding pad and the second bonding pad to connect the first bonding pad to the second bonding pad, and the wire is cut on the second bonding pad.

3. The semiconductor device according to claim 1, wherein the first bonding pad is shorter than the second bonding pad.

4. The semiconductor device according to claim 1, wherein an area of the first bonding pad is smaller than an area of the second bonding pad.

5. The semiconductor device according to claim 1, wherein a size of the first bonding pad is equal to or larger than a size required for bonding the wire on the first bonding pad.

6. The semiconductor device according to claim 1, wherein a size of the second bonding pad is equal to or larger than a size obtained by summing a size required for bonding the wire on the second bonding pad, and a size of a drag mark formed by cutting the wire.

7. The semiconductor device according to claim 1, wherein:
    the semiconductor device is polygonal in a plan view; and
    the second bonding pad is disposed between a corner point of the polygonal semiconductor device and a portion of the field limiting ring that is closest to the corner point.

8. The semiconductor device according to claim 7, wherein the first bonding pad is disposed in a portion of the semiconductor substrate adjacent to the portion of the field limiting ring that is closest to the corner point of the polygonal semiconductor device.

9. A semiconductor device comprising:
- a field limiting ring that is disposed on a semiconductor substrate so as to divide the semiconductor substrate into an inner region and an outer region;
- a first bonding pad that is disposed in the inner region;
- a wire whose one end is bonded to an external circuit, a middle portion of the wire being bonded on the first bonding pad; and
- a second bonding pad that is disposed in the outer region and on which the other end of the wire is bonded,
- wherein the middle portion of the wire is in-between the one end and the other end.

10. A wire bonding method of bonding a wire to the semiconductor device according to claim 1, comprising:
- bonding the wire, whose one end is connected to an external circuit, on the first bonding pad without cutting the wire; and
- bonding the other end of the wire, which is not cut on the first bonding pad, on the second bonding pad; and
- cutting the wire on the second bonding pad.

* * * * *